(12) United States Patent
Kwak

(10) Patent No.: US 11,631,676 B2
(45) Date of Patent: Apr. 18, 2023

(54) SEMICONDUCTOR DEVICE

(71) Applicant: SK hynix Inc., Gyeonggi-do (KR)

(72) Inventor: Sang Hyon Kwak, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 96 days.

(21) Appl. No.: 17/205,708

(22) Filed: Mar. 18, 2021

(65) Prior Publication Data

US 2022/0139916 A1 May 5, 2022

(30) Foreign Application Priority Data

Oct. 29, 2020 (KR) .......................... 10-2020-0141820

(51) Int. Cl.
*H01L 27/108* (2006.01)
*H01L 29/78* (2006.01)
*H01L 23/528* (2006.01)

(52) U.S. Cl.
CPC ...... *H01L 27/10805* (2013.01); *H01L 23/528* (2013.01); *H01L 29/7827* (2013.01)

(58) Field of Classification Search
None
See application file for complete search history.

(56) References Cited

U.S. PATENT DOCUMENTS

| 2004/0026763 | A1* | 2/2004 | Ma ..................... H01L 27/10891 257/E21.654 |
| 2019/0006376 | A1 | 1/2019 | Ramaswamy |
| 2019/0181142 | A1 | 6/2019 | Fishburn |

FOREIGN PATENT DOCUMENTS

KR 10-2020-0105216 9/2020

* cited by examiner

*Primary Examiner* — Mohammad M Hoque
*Assistant Examiner* — Kevin Quinto
(74) *Attorney, Agent, or Firm* — IP & T Group LLP

(57) ABSTRACT

The present disclosure technology provides memory cells and a semiconductor device including the same. According to the present technology, a semiconductor device comprises a plurality of active layers vertically stacked along a first direction over a substrate and horizontally extending along a second direction crossing the first direction; a plurality of bit lines coupled to respective first sides of the active layers and horizontally extending in a third direction crossing the first direction and the second direction; a plurality of capacitors coupled to respective second sides of the active layers; a word line vertically extending through the active layers along the first direction; an upper-level interconnection coupled to an upper end of the word line; and a lower-level interconnection coupled to a lower end of the word line.

20 Claims, 5 Drawing Sheets

SEMICONDUCTOR DEVICE

CROSS-REFERENCE TO RELATED APPLICATIONS

The present application claims priority of Korean Patent Application No. 10-2020-0141820, filed on Oct. 29, 2020, which is herein incorporated by reference in its entirety.

BACKGROUND

1. Field

The present disclosure relates to a semiconductor device, and more particularly, to a memory cell and a semiconductor device including the same.

2. Description of the Related Art

Recently, in order to increase the net die of the memory device, the memory cell has steadily shrunken.

Although the shrinking memory cell is supposed to lead to a reduction in parasitic capacitance (Cb) and an increase in capacitance, it is difficult to increase the net die due to structural limitations of the memory cell.

SUMMARY

Embodiments of the present disclosure provide a highly integrated memory cell and a semiconductor device including the same.

According to an embodiment, a semiconductor device comprises a plurality of active layers vertically stacked along a first direction over a substrate and horizontally extending along a second direction crossing the first direction; a plurality of bit lines coupled to respective first sides of the active layers and horizontally extending in a third direction crossing the first direction and the second direction; a plurality of capacitors coupled to respective second sides of the active layers; a word line vertically extending through the active layers along the first direction; an upper-level interconnection coupled to an upper end of the word line; and a lower-level interconnection coupled to a lower end of the word line.

According to an embodiment, a semiconductor device comprises a first word line oriented along a first direction perpendicular to a substrate and a first memory cell stack sharing the first word line and vertically stacked along the first direction; a second word line vertically oriented along the first direction and a second memory cell stack sharing the second word line and vertically stacked along the first direction; upper-level interconnection coupled to an upper end of the first word line and an upper end of the second word line, respectively; and a lower-level interconnection coupled a lower end of the first word line and a lower end of the second word line, wherein the second memory cell stack and the second word line are horizontally spaced apart from the first memory cell stack and the first word line along a second direction crossing the first direction.

According to an embodiment, a semiconductor device comprises a first memory cell array including a plurality of first vertical word lines extending vertically above the substrate; a second memory cell array including a plurality of second vertical word lines extending vertically above the substrate; a first horizontal interconnection coupled to the first vertical word lines of the first memory cell array; and a second horizontal interconnection coupled to the second vertical word lines of the second memory cell array.

According to an embodiment, a semiconductor device comprises a plurality of active layers vertically stacked on a substrate, a plurality of bit lines connected with respective first sides of the active layers and horizontally oriented, a plurality of capacitors connected with respective second sides of the active layers, a word line vertically oriented through the active layers, and an interconnection interconnecting an upper end and lower end of the word line in a zig-zag manner.

According to an embodiment, a semiconductor device comprises a plurality of memory cell stacks, each memory cell stack comprising a plurality of memory cells stacked vertically over a substrate and a vertical word line coupled to the memory cells; and a plurality of interconnections connecting at least two of the vertical word lines in zig-zag manner to form a chain-shaped word line.

The present technology may reduce the number of access lines of the vertical word lines WL, which are horizontally arranged, by connecting the vertical word lines WL via a chain.

These and other features and advantages of the present invention will become better understood from the following detailed description in conjunction with the accompanying drawings.

DETAILED DESCRIPTION

Figure 1:
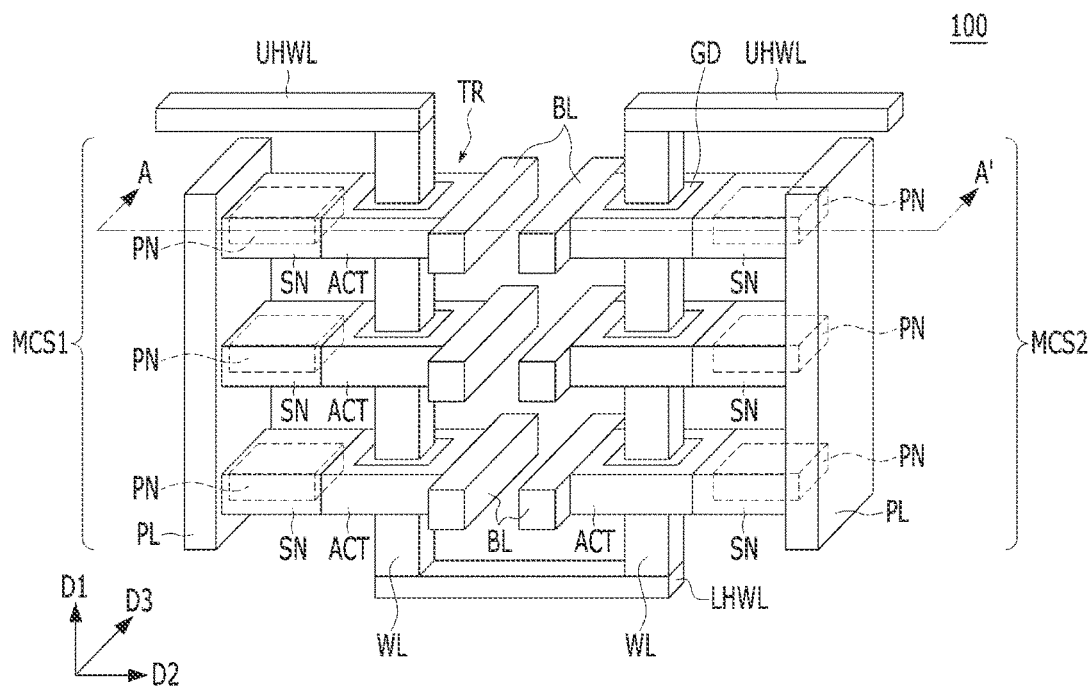
FIG. 1 is a perspective view schematically illustrating a semiconductor device according to an embodiment.

Embodiments of the disclosure are described with reference to cross-sectional views, plan views, or block diagrams. Therefore, the shape of the example views may be modified by manufacturing technology and/or tolerances. Accordingly, embodiments of the present disclosure are not limited to those shown, but rather encompass various changes and modifications due to the manufacturing process. Accordingly, the regions illustrated in the drawings have schematic properties, and the shapes of the regions illustrated in the drawings are intended to illustrate specific shapes of the regions of the device without limiting the scope of the disclosure.

According to the embodiments described below, memory cells may be vertically stacked to increase memory cell density and reduce parasitic capacitance.

Figure 2:
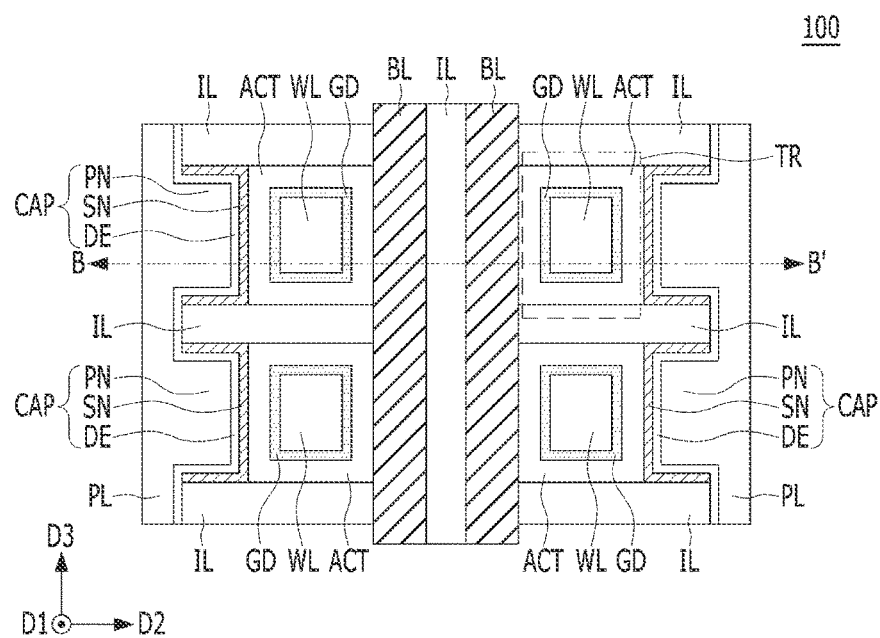
FIG. 2 is a layout view taken along line A-A' of FIG. 1.
Figure 3:
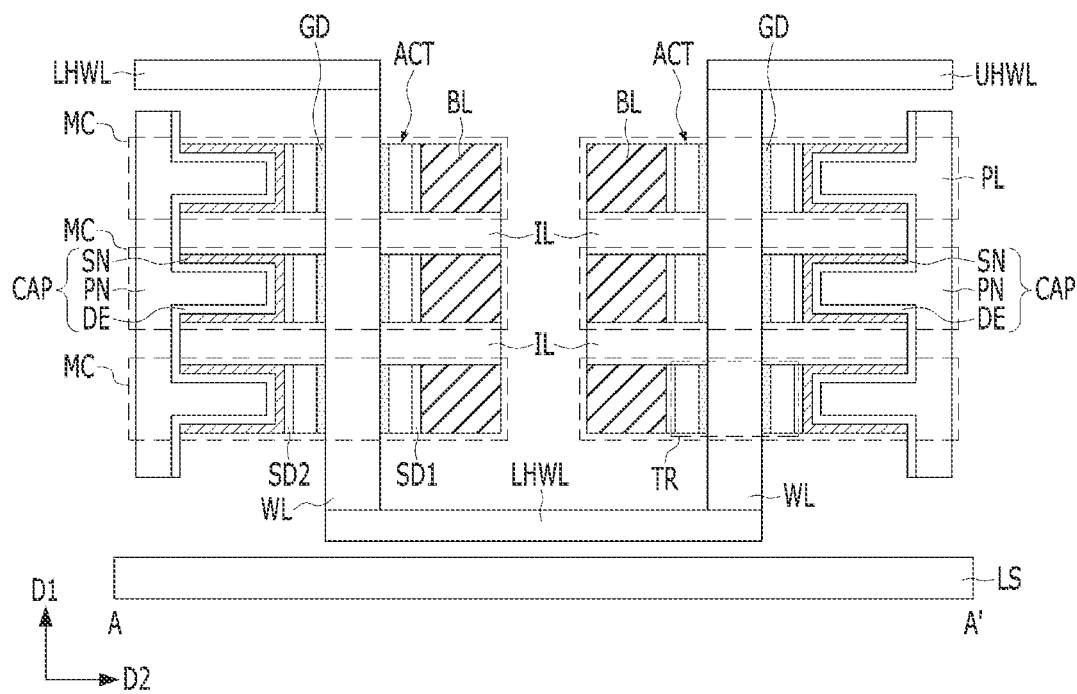
FIG. 3 is a cross-sectional view taken along line B-B' of FIG. 2.

FIG. 1 is a perspective view schematically illustrating a semiconductor device according to an embodiment. FIG. 2 is a layout view taken along line A-A' of FIG. 1. FIG. 3 is a cross-sectional view taken along line B-B' of FIG. 2.

Referring to FIGS. 1 to 3, a semiconductor device 100 may include a substrate LS and a plurality of memory cell stacks MCS1/MCS2 formed on the substrate LS. The memory cell stacks MCS1 and MCS2 may be oriented perpendicular to the substrate LS. The substrate LS may define a plane. The memory cell stacks MCS1 and MCS2 may be oriented perpendicular to the plane of the substrate LS. The memory cell stacks MCS1 and MCS2 may be vertically oriented upwards from the substrate LS along a first direction D1. Each of the memory cell stacks MCS1 and MCS2 may include a three-dimensional array of memory cells MC. Each of the memory cell stacks MCS1 and MCS2 may include a plurality of memory cells MC. In the memory cell stacks MCS1 and MCS2, the plurality of memory cells MC may be vertically stacked along the first direction D1. Individual memory cells MC of the memory cell stacks MCS1 and MCS2 may include a bit line BL, a transistor TR, a capacitor CAP, and a plate line PL. The transistor TR and the capacitor CAP may be horizontally oriented along a second direction D2. Each memory cell MC may further include a word line WL, and the word line WL may be vertically oriented along the first direction D1 perpendicular to an upper surface of the substrate LS. The bit line BL may be horizontally oriented along a third direction D3 parallel to the upper surface of the substrate LS. In each memory cell MC, the bit line BL, the transistor TR, the capacitor CAP, and the plate line PL may be horizontally arranged along the second direction D2. The memory cell stacks MCS1 and MCS2 may be referred to as a memory cell array. The memory cell stacks MCS1 and MCS2 may include a dynamic random access memory (DRAM) memory cell array. In another embodiment, the memory cell stacks MCS1 and MCS2 may include phase change random access memory (PCRAM), resistive random access memory (RERAM), or magnetoresistive random access memory (MRAM), and the capacitor CAP may be replaced with another memory element.

The substrate LS may be formed of any material that is suitable for semiconductor processing. For example, the substrate LS may be selected to include at least one of a conductive material, a dielectric material, and a semiconductor material. Various materials may be formed on the substrate LS. In an embodiment, the substrate LS may include a semiconductor substrate such as, for example, a semiconductor substrate formed of a material containing silicon. Examples of a silicon containing semiconductor substrate may include silicon, monocrystalline silicon, polysilicon, amorphous silicon, silicon germanium, monocrystalline silicon germanium, polycrystalline silicon germanium, carbon-doped silicon, a combination thereof, or multiple layers thereof. The substrate LS may also include other semiconductor materials such as germanium. The substrate LS may include a group III/V semiconductor substrate, for example, a compound semiconductor substrate such as of GaAs. The substrate LS may include a silicon on insulator (SOI) substrate.

The substrate LS may include a peripheral circuit region (not shown). For example, the peripheral circuit region may include a plurality of control circuits for controlling the memory cell array MCA. At least one control circuit of the peripheral circuit region may include an N-channel transistor, a P-channel transistor, a CMOS circuit, or a combination thereof. At least one control circuit of the peripheral circuit region may include an address decoder circuit, a read circuit, and a write circuit. At least one control circuit of the peripheral circuit region may include a planar channel transistor, a recess channel transistor, a buried gate transistor, or a fin field-effect transistor (FinFET).

For example, at least one control circuit of the peripheral circuit region may be electrically connected to the bit line BL. The peripheral circuit region may include a sense amplifier SA, and the sense amplifier SA may be electrically connected to the bit line. Although not shown, a multi-level metal interconnection MLM may be located between the memory cell stacks MCS1 and MCS2 and the substrate LS, and the peripheral circuit region and the bit line BL may be coupled via the multi-level metal interconnection MLM.

The bit line BL may extend along the third direction D3 which is parallel to the upper surface of the substrate LS and orthogonal to the first and second directions D1 and D2. The bit line BL may be spaced apart from the substrate LS and oriented horizontally (or laterally). The bit line BL may also be referred to as a horizontally-oriented bit line or a horizontally-extended bit line. The bit line BL may be formed of any suitable material including, for example, a conductive material. Suitable materials for the bit line BL may include a silicon-base material, a metal-base material, or a combination thereof. For example, suitable materials for the bit line BL may include polysilicon, metal, metal nitride, metal silicide, or a combination thereof. The memory cells MC arranged horizontally along the third direction D3 may share one bit line BL. In some embodiments, the bit line BL may be formed of polysilicon, titanium nitride, tungsten, or a combination thereof. For example, the bit line BL may be formed of polysilicon or titanium nitride (TiN) doped with an N-type impurity. In some embodiments, the bit line BL may be formed of a stack (TiN/W) of titanium nitride and tungsten. The bit line BL may further include an ohmic contact layer such as metal silicide.

The transistor TR may be horizontally arranged along the second direction D2 parallel to the surface of the substrate LS. That is, the transistor TR may be horizontally positioned between the bit line BL and the capacitor CAP. The transistor TR may be positioned at a higher level than the substrate LS, and the transistor TR and the substrate LS may be spaced apart from each other.

The transistor TR may include an active layer ACT, a gate dielectric layer GD, and a word line WL. The word line WL may extend vertically along the first direction D1, and the active layer ACT may extend horizontally along the second direction D2. The first direction D1 may be a direction perpendicular to the second direction D2. The active layer ACT may be horizontally arranged from the bit line BL. The active layer ACT may be oriented parallel to the plane of the substrate LS.

The word line WL may have a pillar-shape penetrating the active layer ACT. The word line WL may be referred to as a pillar-shaped word line or a vertical word line. A gate dielectric layer GD may be formed on a sidewall of the word line WL. The gate dielectric layer GD may surround the sidewall of the word line WL.

The gate dielectric layer GD may be formed of any suitable material including, for example, silicon oxide, silicon nitride, metal oxide, metal oxynitride, metal silicate, high-k material, ferroelectric material, anti-ferroelectric material, or a combination thereof. In some embodiments, the gate dielectric layer GD may be made of $SiO_2$, $Si_3N_4$, $HfO_2$, $Al_2O_3$, $ZrO_2$, AlON, HfON, HfSiO, or HfSiON.

Suitable materials for the word line WL may include a metal, a metal mixture, a metal alloy, or a semiconductor material. In some embodiments, suitable materials for the word line WL may include titanium nitride, tungsten, polysilicon, or a combination thereof. For example, in some embodiments, the word line WL may be made of a TiN/W stack in which titanium nitride and tungsten are sequentially stacked. The word line WL may be made of an N-type work function material or a P-type work function material. For example, the N-type work function material may have a low work function of 4.5 or less, and the P-type work function material may have a high work function of 4.5 or more.

The word line WL and the bit line BL may extend in directions crossing each other.

Suitable materials for the active layer ACT may include a semiconductor material such as polysilicon. The active layer ACT may include a plurality of impurity regions. The impurity regions may include a first source/drain region SD1 and a second source/drain region SD2. In some embodiments, the active layer ACT may include doped polysilicon, undoped polysilicon, amorphous silicon, or an oxide semiconductor material. The first source/drain region SD1 and the second source/drain region SD2 may be doped with an N-type impurity or a P-type impurity. The first source/drain region SD1 and the second source/drain region SD2 may be doped with the same conductivity type impurity. The first source/drain region SD1 and the second source/drain region SD2 may be doped with N-type impurities. The first source/drain region SD1 and the second source/drain region SD2 may be doped with P-type impurities. The first source/drain region SD1 and the second source/drain region SD2 may include at least any one impurity selected from among arsenic (As), phosphorus (P), boron (B), indium (In), and combinations thereof. The bit line BL may be electrically connected to a first edge portion of the active layer ACT, and the capacitor CAP may be electrically connected to a second edge portion of the active layer ACT. The first edge portion of the active layer ACT may be provided by the first source/drain regions SD1, and the second edge portion of the active layer ACT may be provided by the second source/drain regions SD2.

The active layers ACT adjacent to each other along the third direction D3 may be separated and supported by a separation layer IL. The separation layer IL may be positioned between the memory cells MC adjacent to each other along the third direction D3. The separation layer IL may be positioned between the memory cells MC adjacent to each other along the second direction D2. The separation layer IL may be positioned between the memory cells MC adjacent to each other along the first direction D1. The separation layer IL may include an insulating material (or dielectric material), such as an oxide.

The capacitor CAP may be horizontally disposed from the transistor TR. The capacitor CAP may horizontally extend from the active layer ACT along the second direction D2. The capacitor CAP may include a storage node SN, a dielectric layer DE, and a plate node PN. The storage node SN, the dielectric layer DE, and the plate node PN may be horizontally arranged along the second direction D2. The storage node SN may have a horizontally oriented cylinder-shape, and the plate node PN may be shaped to extend to a cylinder inner wall and cylinder outer wall of the storage node SN. The dielectric layer DE may be positioned inside the storage node SN while surrounding the plate node PN. The plate node PN may be connected to the plate line PL. The storage node SN may be electrically connected to the second source/drain region SD2.

The capacitor CAP may be, for example, a metal-insulator-metal (MIM) capacitor. In an embodiment, the storage node SN and the plate node PN may be made of a metal-base material. In an embodiment, the dielectric layer DE may be made of silicon oxide, silicon nitride, a high-k material, or a combination thereof. The high-k material may have a higher dielectric constant than silicon oxide. Silicon oxide ($SiO_2$) may have a dielectric constant of about 3.9, and the dielectric layer DE may include a high-k material having a dielectric constant of 4 or more. The high-k material may have a dielectric constant of about 20 or more. Suitable high-k materials may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer DE may be formed of a composite layer including two or more layers of the high-k materials mentioned above.

The dielectric layer DE may be formed of zirconium-base oxide. The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as zirconium oxide-base layer ($ZrO_2$-base layer). In another embodiment, the dielectric layer DE may be formed of hafnium-base oxide. The dielectric layer DE may have a stack structure including hafnium oxide ($HfO_2$). A stack structure including hafnium oxide ($HfO_2$) may include an HA ($HfO_2/Al_2O_3$) stack or a HAH ($HfO_2/Al_2O_3/HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as hafnium oxide-base layer ($HfO_2$-base layer). In the ZA stack, ZAZ stack, HA stack, and HAH stack, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band gap material having a larger band gap than that of the high-k material. The dielectric layer DE may include silicon oxide ($SiO_2$) as a high band gap material other than aluminum oxide ($Al_2O_3$). Since the dielectric layer DE contains a high band gap material, leakage current can be suppressed. The high bandgap material may be extremely thin. For example, the high band gap material may be thinner than the high-k material. In another embodiment, the dielectric layer DE may include a laminated structure in which a high-k material and a high band gap material are alternately stacked. For example, it may include ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the laminated structure as above, the aluminum oxide ($Al_2O_3$) may be extremely thin. For example, a thickness of the aluminum oxide ($Al_2O_3$) may be 1 Å~5 Å.

In another embodiment, the dielectric layer DE may include a stack structure including zirconium oxide, hafnium oxide, and aluminum oxide, a laminated structure, or a mutually mixed structure.

In another embodiment, an interface control layer (not shown) for mitigating leakage current may be further formed between the storage node SN and the dielectric layer DE. The interface control layer may include titanium oxide ($TiO_2$). The interface control layer may also be formed between the plate node PN and the dielectric layer DE.

Suitable materials for the storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may be made of titanium (Ti), titanium nitride (TiN), tantalum (Ta), tantalum nitride (TaN), tungsten (W), tungsten nitride (WN), ruthenium (Ru), ruthenium oxide (RuO$_2$), iridium (Ir), iridium oxide (IrO$_2$), platinum (Pt), molybdenum (Mo), molybdenum oxide (MoO), titanium nitride/tungsten (TiN/W) stack, or tungsten nitride/tungsten (WN/W) stack. The plate node PN may include a combination of a metal-base material and a silicon-base material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the inside of the cylinder of the storage node SN, and titanium nitride (TiN) may serve substantially as the plate node of the capacitor CAP. Tungsten nitride may be a low resistance material. The adjacent plate nodes PN may be jointly connected to the plate line PL. The bottom of the plate line PL may be insulated from the substrate LS.

The storage node SN may have a three-dimensional (3D) structure, and the 3D structure of storage node SN may be a horizontal 3D structure oriented along the second direction D2. As an example of the 3D structure, the storage node SN may have a cylinder shape, a pillar shape, or a pylinder shape. The pylinder shape may refer to a structure in which a pillar shape and a cylinder shape are merged.

Referring back to FIG. 3, the separation layers IL and the active layers ACT may be alternately stacked along the first direction D1. A plurality of word lines WL may be formed to vertically penetrate the active layers ACT and the separation layers IL. A plurality of bit lines BL horizontally oriented along the third direction D3 may be formed in a direction crossing the word lines WL. The word lines WL horizontally adjacent to each other along the second direction D2 may be electrically connected to each other. For example, the word lines WL may be coupled by a plurality of interconnections LHWL and UHWL. The plurality of interconnections LHWL and UHWL may include, for example, a lower-level interconnection LHWL and an upper-level interconnection UHWL. The lower-level interconnection LHWL may interconnect the bottoms of the word lines WL. The upper-level interconnection UHWL may be connected to an upper portion of any one of the word lines WL. The lower-level interconnection LHWL may be positioned at a lower-level than the word line WL, and the upper-level interconnection UHWL may be positioned at a higher level than the word line WL. An electrical path may be provided between the word lines WL by a plurality of interconnections LHWL and UHWL. The plurality of interconnections LHWL and UHWL may be formed of, for example, a metal-base material such as tungsten. The plurality of interconnections LHWL and UHWL may be horizontally oriented along the second direction D2.

As described above, the number of access lines of the word lines WL may be reduced by connecting the word lines WL horizontally arranged along the second direction D2 via a chain. The word lines WL may be referred to as pillar-shaped word lines PWL, and the interconnections LHWL and UHWL may be referred to as horizontal word lines HWL. In another embodiment, the interconnections LHWL and UHWL may be referred to as horizontal access lines.

As set forth above, the semiconductor device 100 may include a word line WL vertically oriented from a substrate LS along a first direction D1 and a memory cell stack MCS1 sharing the word line WL and vertically stacked along the first direction D1, a word line WL vertically oriented along the first direction D1 and a memory cell stack MCS2 sharing the word line WL and vertically stacked along the first direction D1, upper-level interconnections UHWL connected to an upper end of the word line WL of the memory cell stack MCS1 and an upper end of the word line WL of the memory cell stack MCS2, and a lower-level interconnection LHWL interconnecting a lower end of the word line WL of the memory cell stack MCS1 and a lower end of the word line WL of the memory cell stack MCS2. The word line WL of the memory cell stack MCS2 may be horizontally spaced apart from the word line WL of the memory cell stack MCS1 along the second direction D2 crossing the first direction D1.

Figure 4:
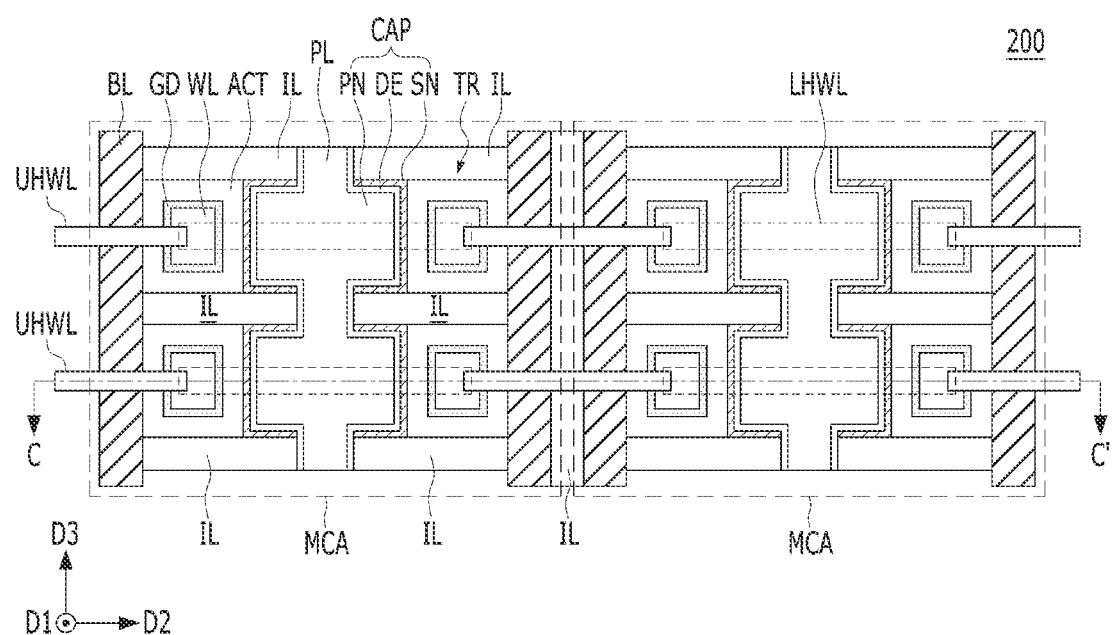
FIG. 4 is a layout view illustrating a semiconductor device according to another embodiment.
Figure 5:
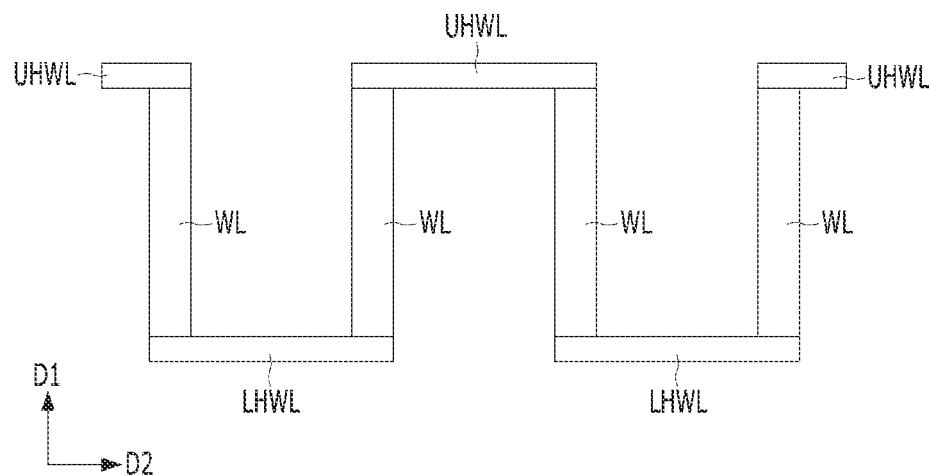
FIG. 5 is a cross-sectional view taken along line C-C' of FIG. 4, illustrating a chain structure of word lines.

FIG. 4 is a layout view illustrating a semiconductor device according to another embodiment. FIG. 5 is a cross-sectional view taken along line C-C' of FIG. 4, illustrating a chain structure of word lines.

In FIG. 4, the same reference denotations as those shown in FIGS. 1 to 3 denote the same elements. The semiconductor device 200 may be similar to the semiconductor device 100 of FIGS. 1 to 3. Duplicate description of the same or substantially the same elements may be omitted.

Referring to FIGS. 4 and 5, the semiconductor device 200 may include mirrored memory cell arrays MCA sharing a plate line PL. Each of the mirrored memory cell arrays MCA may include the memory cells MC shown in FIGS. 1 to 3. The mirrored memory cell arrays MCA may be referred to as mirrored memory cell stacks MCS. Each memory cell MC may include a bit line BL, a transistor TR, and a capacitor CAP. The transistor TR may include an active layer ACT, a word line WL penetrating through the active layer ACT, and a gate dielectric layer GD surrounding a sidewall of the word line WL. The word lines WL may be vertically oriented along the first direction D1. The word lines WL may be horizontally arranged apart from each other along the second and third directions D2 and D3. The word lines WL arranged horizontally along the second direction D2 may be coupled by a plurality of interconnections UHWL and LHWL. The word lines WL arranged horizontally along the second direction D2 may have a chain shape in which they are coupled in a zig-zag manner by the plurality of interconnections UHWL and LHWL. The word lines WL arranged horizontally along the third direction D3 may not be coupled. That is, the plurality of interconnections UHWL and LHWL may not coupled the word lines WL arranged horizontally along the third direction D3.

Figure 6:
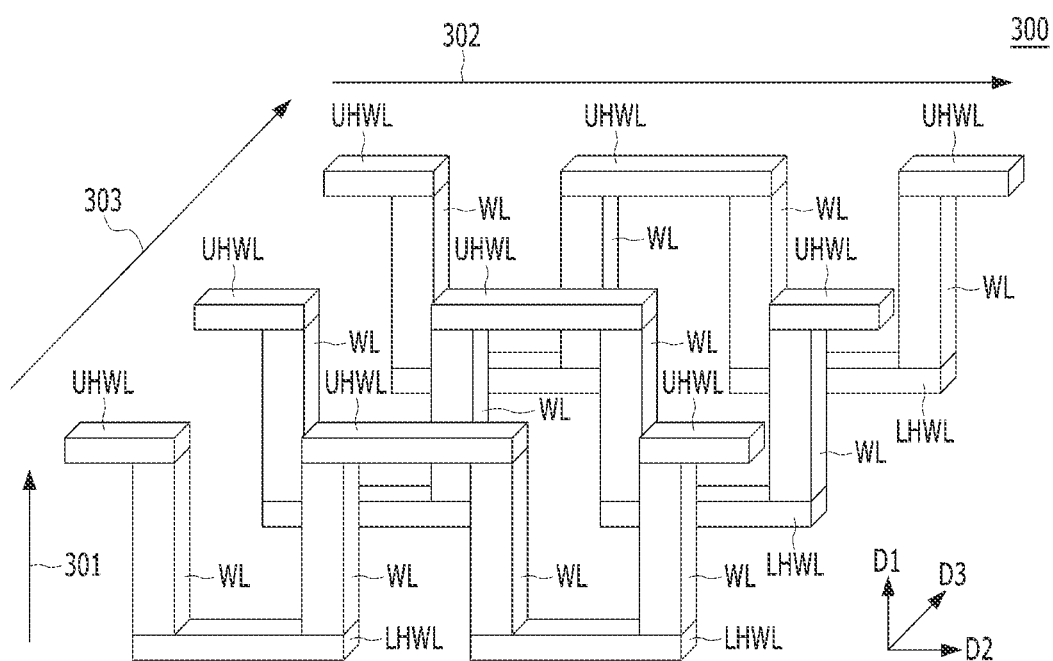
FIG. 6 is a view schematically illustrating a chain structure of word lines according to another embodiment.

FIG. 6 is a view schematically illustrating a chain structure of word lines according to another embodiment.

Referring to FIG. 6, a semiconductor device 300 may include a plurality of memory cell arrays 301, 302, and 303. The memory cell array 301 vertically arranged along the first direction D1 may share the word line WL. The memory cell array 302 may include a plurality of word lines WL. The word lines WL of the memory cell array 302 horizontally arranged along the second direction D2 may have a chain shape that they are coupled in a zig-zag manner by a plurality of interconnections UHWL and LHWL. The word lines WL of the memory cell array 303 arranged horizontally along the third direction D3 may not be coupled. The memory cell array 302 may include a horizontal array of memory cell stacks. Each of memory cell stacks may include vertically-stacked memory cells. Each of the memory cell stacks in the memory cell array 302 sharing each of the word lines WL.

Figure 7:
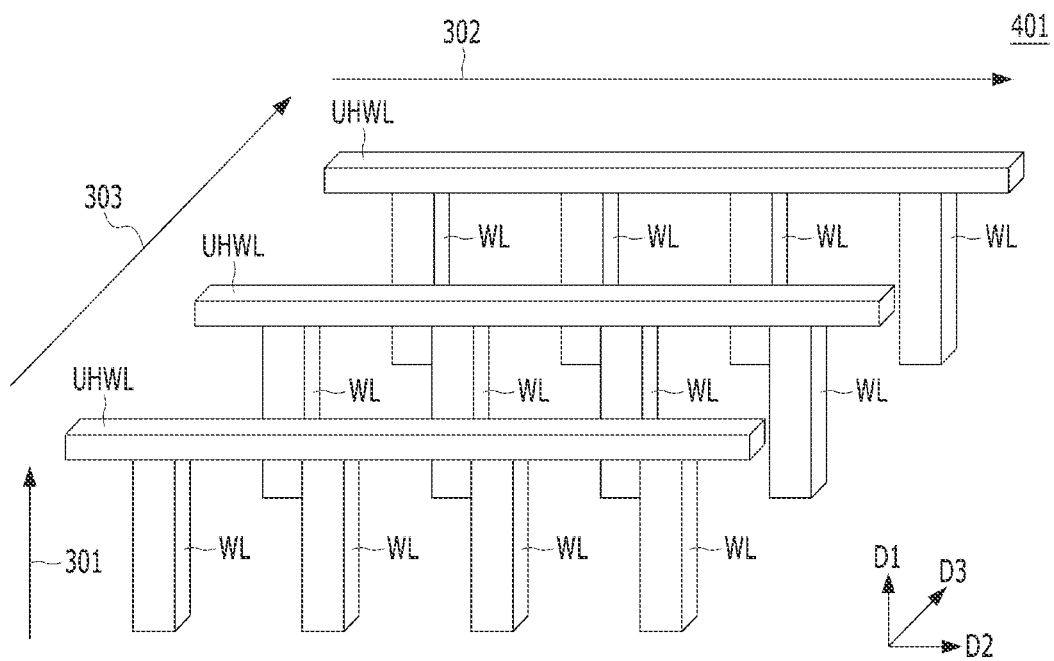
FIGS. 7, 8, and 9 are views schematically illustrating a chain structure of word lines according to other embodiments.
Figure 8:
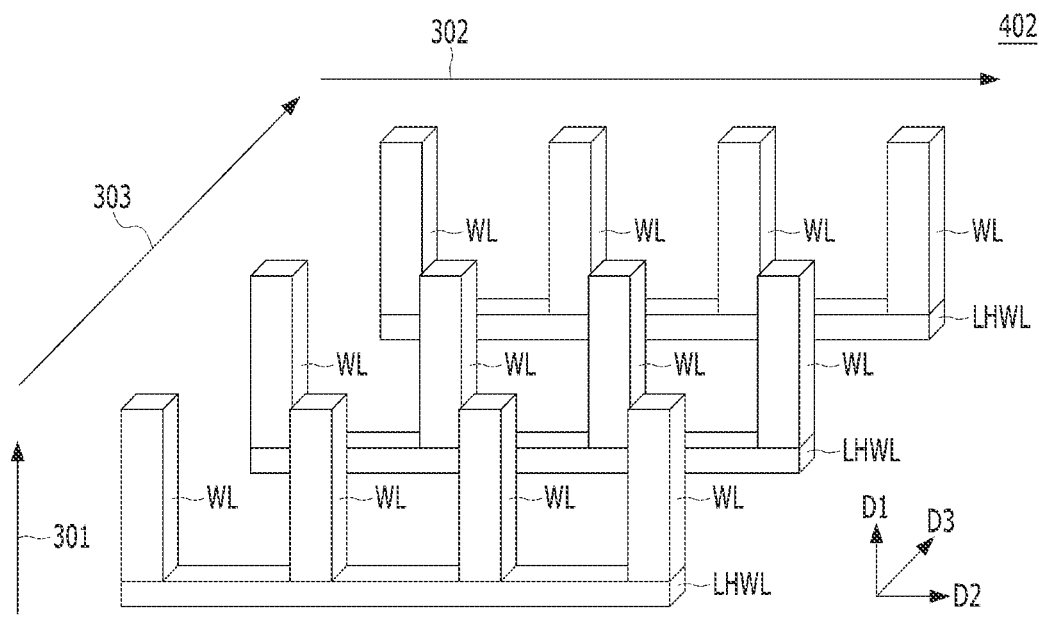
Figure 9:
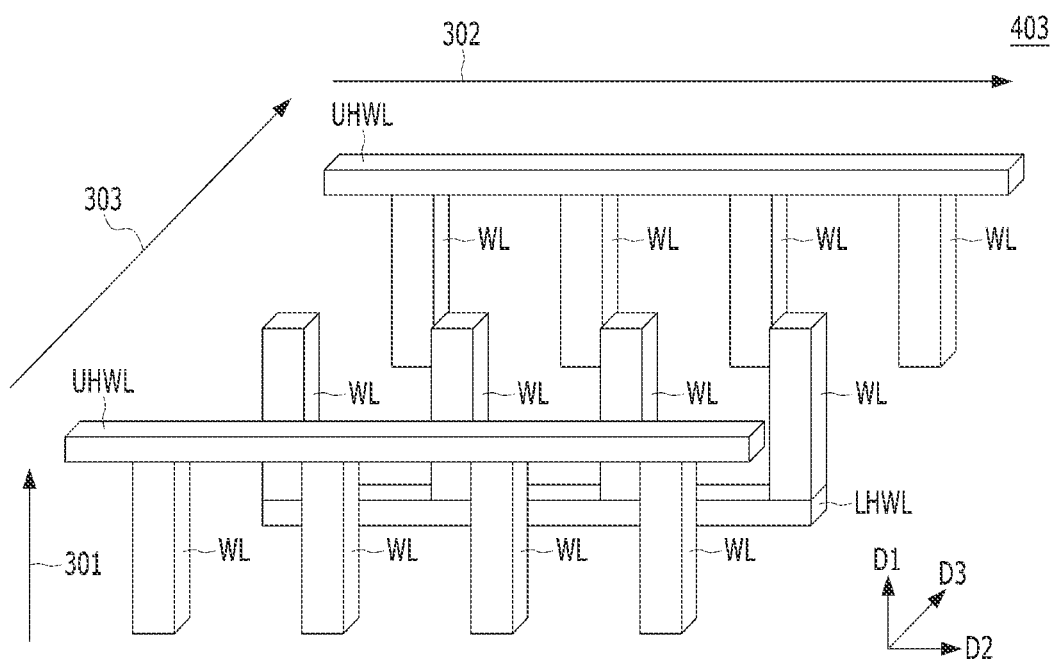

FIGS. 7, 8, and 9 are views schematically illustrating a chain structure of word lines according to other embodiments. In FIGS. 7 to 9, the same reference denotations as those shown in FIGS. 1 to 6 denote the same elements. The semiconductor devices 401, 402, and 403 may be similar to the semiconductor devices 100, 200, and 300 of FIGS. 1 to 6. Duplicate description of the same or substantially the same elements may be omitted.

Referring to FIG. 7, a semiconductor device 401 may include a plurality of memory cell arrays 301, 302, and 303. The memory cell array 301 vertically arranged along the first direction D1 may share the word line WL. The word lines WL of the memory cell array 302 horizontally arranged along the second direction D2 may have a chain shape that they are coupled by an upper-level interconnection UHWL. The word lines WL of the memory cell array 303 arranged horizontally along the third direction D3 may not be coupled. The semiconductor device 401 of FIG. 7 may not include the lower-level interconnections LHWL unlike the semiconductor device 300 of FIG. 6.

Referring to FIG. 8, a semiconductor device 401 may include a plurality of memory cell arrays 301, 302, and 303. The memory cell array 301 vertically arranged along the first direction D1 may share the word line WL. The word lines WL of the memory cell array 302 horizontally arranged along the second direction D2 may have a chain shape that they are coupled by the lower-level interconnection LHWL. The word lines WL of the memory cell array 303 arranged horizontally along the third direction D3 may not be coupled. The semiconductor device 402 of FIG. 8 may not include the upper-level interconnection UHWL unlike the semiconductor device 300 of FIG. 6.

Referring to FIG. 9, a semiconductor device 403 may include a plurality of memory cell arrays 301, 302, and 303. The memory cell array 301 vertically arranged along the first direction D1 may share the word line WL. The word lines WL of the odd-numbered memory cell array 302 horizontally arranged along the second direction D2 may have a chain shape, in which the world lines WL of the odd-numbered memory cell array 302 are coupled by the upper-level interconnection UHWL. The word lines WL of the even-numbered memory cell array 302 horizontally arranged along the second direction D2 may have a chain shape, in which the word lines WL of the even-numbered memory cell array 302 are coupled by the lower-level interconnection LHWL. The word lines WL of the memory cell array 303 arranged horizontally along the third direction D3 may not be coupled.

Although the disclosure is shown and described with reference to various embodiments thereof, it will readily be appreciated by one of ordinary skill in the art that various changes or modifications may be made thereto without departing from the scope of the disclosure.

What is claimed is:

1. A semiconductor device, comprising:
a plurality of active layers vertically stacked along a first direction over a substrate and horizontally extending along a second direction crossing the first direction;
a plurality of bit lines coupled to respective first sides of the active layers and horizontally extending in a third direction crossing the first direction and the second direction;
a plurality of capacitors coupled to respective second sides of the active layers;
a word line vertically extending through the active layers along the first direction;
an upper-level interconnection coupled to an upper end of the word line; and
a lower-level interconnection coupled to a lower end of the word line.

2. The semiconductor device of claim 1, wherein the upper-level interconnection and the lower-level interconnection are horizontally oriented along the second direction.

3. The semiconductor device of claim 1, wherein the active layers, the bit lines, and the capacitors are positioned at the same level.

4. The semiconductor device of claim 1, wherein each of the capacitors includes:
a cylindrical storage node connected to the respective second sides of the active layers;
a dielectric layer on the cylindrical storage node; and
a plate node on the dielectric layer,
wherein the cylindrical storage node is horizontally oriented along the second direction.

5. The semiconductor device of claim 4, further comprising a plate line commonly coupled to plate nodes of the capacitors,
wherein the plate line is vertically extended along the first direction.

6. The semiconductor device of claim 1, further comprising gate dielectric layers between the active layers and the word line.

7. A semiconductor device, comprising:
a first word line oriented along a first direction perpendicular to a substrate and a first memory cell stack sharing the first word line and vertically stacked along the first direction;
a second word line vertically oriented along the first direction and a second memory cell stack sharing the second word line and vertically stacked along the first direction;
upper-level interconnections coupled to an upper end of the first word line and an upper end of the second word line, respectively; and
a lower-level interconnection coupled to a lower end of the first word line and a lower end of the second word line,
wherein the second memory cell stack and the second word line are horizontally spaced apart from the first memory cell stack and the first word line along a second direction crossing the first direction.

8. The semiconductor device of claim 7, wherein
the upper-level interconnections and the lower-level interconnection are horizontally oriented along the second direction.

9. The semiconductor device of claim 7, wherein
each of the first memory cell stack and the second memory cell stack includes:
a plurality of active layers vertically stacked over the substrate along the first direction and horizontally oriented along the second direction;
a plurality of bit lines coupled to respective first sides of the active layers and horizontally oriented in a direction crossing the first direction and the second direction; and
a plurality of capacitors coupled to respective second sides of the active layers,
wherein the first word line vertically penetrates the active layers of the first memory cell stack along the first direction, and the second word line vertically penetrates the active layers of the second memory cell stack along the first direction.

10. The semiconductor device of claim 9, wherein the active layers, the bit lines, and the capacitors are positioned at the same level.

11. The semiconductor device of claim 9, wherein each of the capacitors includes:
a cylindrical storage node connected to the respective second sides of the active layers;
a dielectric layer on the cylindrical storage node; and
a plate node on the dielectric layer, wherein the cylindrical storage node is horizontally oriented along the second direction.

12. The semiconductor device of claim 11, further comprising a plate line commonly coupled to plate nodes of the capacitors, wherein the plate line is vertically oriented along the first direction.

13. The semiconductor device of claim 9, further comprising gate dielectric layers between the active layers and the first and second word lines.

14. A semiconductor device, comprising:
a first memory cell array including a plurality of first vertical word lines extending vertically above a substrate;
a second memory cell array including a plurality of second vertical word lines extending vertically above the substrate;
a first horizontal interconnection coupled to the first vertical word lines of the first memory cell array; and
a second horizontal interconnection coupled to the second vertical word lines of the second memory cell array,
wherein each of the first and second memory cell arrays includes a plurality of active layers vertically stacked over the substrate, and
wherein the first vertical word lines and the second vertical word lines penetrate the active layers.

15. The semiconductor device of claim 14, wherein
each of the first horizontal interconnection and the second horizontal interconnection includes upper-level interconnections having a higher level than the first memory cell array and the second memory cell array and lower-level interconnections having a lower-level than the first memory cell array and the second memory cell array, and
wherein the upper-level interconnections and the lower-level interconnections are oriented horizontally to the substrate.

16. The semiconductor device of claim 15, wherein the first vertical word lines are coupled in a zig-zag manner by the upper-level interconnections and the lower-level interconnections to a first chain-shaped word line, and
the second vertical word lines are coupled in zig-zag manner by the upper-level interconnections and the lower-level interconnections to a second chain-shaped word line.

17. The semiconductor device of claim 14, wherein
the first memory cell array comprises a horizontal array of first memory cell stacks including vertically-stacked first memory cells, each of the first memory cell stacks shares each of the first vertical word lines, and
wherein the second memory cell array comprises a horizontal array of second memory cell stacks including vertically-stacked second memory cells, each of the second memory cell stacks shares each of the second vertical word lines.

18. The semiconductor device of claim 14, wherein
each of the first and second memory cell arrays further includes:
a plurality of horizontally-oriented bit lines coupled to respective first sides of the active layers;
a plurality of capacitors coupled to respective second sides of the active layers; and
a plate line commonly coupled to the capacitors.

19. The semiconductor device of claim 18, wherein
the active layers, the bit lines, and the capacitors are positioned at the same level.

20. The semiconductor device of claim 18, wherein
each of the capacitors includes:
a horizontally-oriented cylindrical storage node coupled to the respective second sides of the active layers;
a dielectric layer on the horizontally-oriented cylindrical storage node; and
a plate node on the dielectric layer.

* * * * *